(12) United States Patent
Kindig

(10) Patent No.: US 7,632,446 B1
(45) Date of Patent: Dec. 15, 2009

(54) SYSTEM AND METHOD OF SEALING ELECTRICAL COMPONENTS IN A FRAME TRAY

(75) Inventor: Michael A. Kindig, Chagrin Falls, OH (US)

(73) Assignee: Lincoln Global, Inc., City of Industry, CA (US)

( * ) Notice: Subject to any disclaimer, the term of this patent is extended or adjusted under 35 U.S.C. 154(b) by 0 days.

(21) Appl. No.: 12/128,220

(22) Filed: May 28, 2008

(51) Int. Cl.
*B32B 37/12* (2006.01)
*B29C 45/14* (2006.01)
(52) U.S. Cl. ............. 264/261; 264/272.15; 264/272.14
(58) Field of Classification Search ................. 264/261, 264/272.16, 272.21, 272.15, 272.14
See application file for complete search history.

(56) References Cited

U.S. PATENT DOCUMENTS

| | | | |
|---|---|---|---|
| 3,809,882 A | 5/1974 | Wetmore | |
| 4,045,867 A * | 9/1977 | Strom | ......................... 29/856 |
| 4,914,267 A | 4/1990 | Derbyshire | |
| 5,036,248 A | 7/1991 | McEwan et al. | |
| 5,053,595 A | 10/1991 | Derbyshire | |
| 5,107,095 A | 4/1992 | Derbyshire | |
| 5,189,271 A | 2/1993 | Derbyshire | |
| 5,337,604 A | 8/1994 | Van Bavel et al. | |
| 5,828,807 A | 10/1998 | Tucker et al. | |
| 5,982,972 A | 11/1999 | Tucker et al. | |
| 6,050,278 A | 4/2000 | Arnal et al. | |
| 6,062,095 A | 5/2000 | Mulrooney et al. | |
| 6,152,597 A | 11/2000 | Potega | |
| 6,192,900 B1 | 2/2001 | Arnal et al. | |
| 6,363,784 B1 | 4/2002 | Gregory | |
| 6,660,562 B2 * | 12/2003 | Lee | ............................ 438/112 |
| 7,059,769 B1 | 6/2006 | Potega | |
| 7,287,873 B2 | 10/2007 | Galli | |
| 2006/0061938 A1* | 3/2006 | Dombro et al. | ............. 361/502 |

* cited by examiner

*Primary Examiner*—Khanh Nguyen
*Assistant Examiner*—Vishal I Patel
(74) *Attorney, Agent, or Firm*—Hahn Loeser & Parks, LLP; Timothy D. Smith

(57) ABSTRACT

Electrical components mounted onto a circuit board may be sealed within a frame tray upon the addition of a curable material that encapsulates the circuit board. The electrical components of the circuit board are positioned and sealed within the frame tray such that the cured material does not affect an airflow path which dissipates heat produced by the electrical components during use. The curing of the curable material shields the circuit board from moisture, dust and other environmental contaminates.

7 Claims, 6 Drawing Sheets

PROVIDING A CIRCUIT BOARD HAVING ONE OR MORE CAPACITORS EXTENDING FROM THE CIRCUIT BOARD

PROVIDING A FRAME TRAY CONFIGURED TO RECEIVE THE CIRCUIT BOARD, THE FRAME TRAY DEFINING A REGION FOR ENCASING THE CIRCUIT BOARD, AND WHEREIN THE FRAME TRAY INCLUDES ONE OR MORE APERTURES FOR RECEIVING THE ONE OR MORE CAPACITORS RESPECTIVELY

INSTALLING THE CIRCUIT BOARD INTO THE FRAME TRAY WHEREBY THE ONE OR MORE CAPACITORS EXTEND THROUGH THE ONE OR MORE APERTURES, AND WHEREIN THE DISTANCE BETWEEN THE ONE OR MORE APERTURE CIRCUMFERENCES AND THE ONE OR MORE CAPACITORS DEFINES A GAP

INSTALLING HEAT SHRINK TUBING TO SPAN THE GAP

APPLYING HEAT TO SHRINK THE HEAT SHRINK TUBING THEREBY SEALING THE GAP

FILLING AT LEAST PART OF THE REGION WITH A CURABLE RESIN FOR ENCASING THE CIRCUIT BOARD

SYSTEM AND METHOD OF SEALING ELECTRICAL COMPONENTS IN A FRAME TRAY

TECHNICAL FIELD

The invention relates to system and methods of sealing electrical components in a frame tray. More particularly, the invention relates to system and methods of sealing electrical capacitors in a frame tray before application of a potting compound to the frame tray.

BACKGROUND OF THE INVENTION

Many electronic devices are mounted on circuit boards, which typically include a plurality of electronic components, which are then typically sold and shipped as a unit. Whether or not mounted on a circuit board, it is widely accepted that electronic circuits are formed of a plurality of electronic components, and that such circuits are sold and shipped as a unit. The prior art, however, fails to provide adequate insulation, weatherization, encapsulation, or protection for such modern electronic devices, mounted on circuit boards that are part of exchangeable frame trays that house the printed circuit boards in various pieces of equipment such as welders.

A known welder unit typically consists of a number of circuit boards and subassemblies that are mounted separately inside the welder. These individual components and subassemblies perform in conjunction with each other to produce an output required for welding. The main power supply components for the welder include any or all of the following: transformers, capacitors, rectifiers, and printed circuit boards. Wiring connects the components to one another and the fan can cool the components.

There is a need for the sealing of electronic components which are mounted on printed circuit boards housed in a frame tray, wherein the printed circuit boards are encapsulated in a potting compound to protect the printed circuit board from environmental contaminates. However, in the current state of the art, much of the potting compound leaks out before it has sufficient time to harden or cure. The embodiments of the subject invention obviate the aforementioned problems.

BRIEF SUMMARY

In one embodiment, a method of encapsulating an electrical circuit in a frame tray, includes the steps of providing a frame tray having walls defining a region for housing an electrical circuit that has one or more electrical components, the frame tray including at least a first aperture for receiving the one or more electrical components, positioning the electrical circuit within the region thereby inserting the one or more electrical components through the at least a first aperture, wherein the distance between the one or more electrical components and the circumference of the at least a first aperture defines a gap, installing at least a first conformable band that spans the gap for sealing against the flow of fluid material, and at least partially filling the frame tray with fluid material thereby encapsulating at least a portion of the electrical circuit.

In one aspect of the embodiments of the subject invention, the at least a conformable band is a shrinkable band.

In another aspect of the embodiments of the subject invention, the shrinkable band is heat activated to shrink from a first diameter to a second smaller diameter.

In yet another aspect of the embodiments of the subject invention, the method also includes providing tape having at least one side coated with an adhesive.

In still another aspect of the embodiments of the subject invention, installing at least a first conformable band that spans the gap includes applying the tape to seal the gap between the one or more electrical components and the at least a first aperture.

In even another aspect of the embodiments of the subject invention, the fluid material comprises a curable material.

In another aspect of the embodiments of the subject invention, the curable material is a potting compound selected from the group of: a one component epoxy system, a two component epoxy system, a one component silicone system, a two component silicone system, a polyurethane system, a polyester system and mixtures thereof.

In another embodiment, a method of encapsulating a circuit board includes the steps of providing a circuit board having one or more capacitors extending from the circuit board, providing a frame tray configured to receive the circuit board, the frame tray defining a region for encasing the circuit board, and wherein the frame tray includes one or more apertures for receiving the one or more capacitors respectively, installing the circuit board into the frame tray whereby the one or more capacitors extend through the one or more apertures, and wherein the distance between the one or more aperture circumferences and the one or more capacitors define a gap, installing heat shrink tubing to span the gap, applying heat from an associated heat source to shrink the heat shrink tubing thereby sealing the gap, and filling at least part of the region with a curable resin for encasing the circuit board.

In yet another embodiment, a system for encapsulating a circuit board includes a circuit board including one or more electrical components extending from the circuit board, a frame tray comprising one or more walls defining a volume for housing the circuit board, the one or more walls having at least a first aperture configured to receive the one or more electrical components, wherein the distance between the one or more electrical components and the circumference of the at least a first aperture defines a gap, and a band of material applied to cover the gap for sealing against the flow of fluid materials.

In one aspect of the embodiments of the subject invention, a dielectric material is included for at least partially encapsulating the circuit board, and wherein when the circuit board is received within the frame tray, a volume is defined for containing the dielectric material.

In even another embodiment, a system for encapsulating an associated electrical circuit having associated electrical components includes a frame tray having one or more walls defining a volumetric region that is configured to house an associated electrical circuit, the one or more walls including at least a first aperture for receiving an associated electrical component extending from the associated electrical circuit, wherein the distance between the associated electrical component and the circumference of the at least a first aperture defines a gap, a fluid material at least partially filling the volumetric region for covering at least part of the associated electrical circuit, and means for inhibiting the flow of the fluid material through the gap.

In one aspect of the embodiments of the subject invention means for inhibiting comprises at least a first band operatively configured to span the gap for inhibiting the flow of the fluid material through the gap.

In another aspect of the embodiments of the subject invention, the distance defining the gap varies at different points around the circumference of the at least a first aperture, and the at least a first band is generally pliable for conforming to seal the gap.

In yet another aspect of the embodiments of the subject invention, the at least a first band is tubular and is constructed from a polymeric material.

In even another aspect of the embodiments of the subject invention, the at least a first band is a thermoplastic material selected from the group consisting of: a polyolefin, a fluoropolymer, a polyvinyl chloride, a polychloroprene, a silicone elastomer.

In still another aspect of the embodiments of the subject invention, the at least a first band is shrinkable material for sealing the gap.

In still yet another aspect of the embodiments of the subject invention, the shrinkable material is heat shrink tubing that conforms to variances in distance defining the gap.

In another aspect of the embodiments of the subject invention, the fluid material is capable of solidifying for encapsulating the associated electrical circuit and may be curable for hardening around at least part of the associated electrical circuit thereby encapsulating the associated electrical circuit.

BRIEF DESCRIPTION OF THE DRAWINGS

FIG. 6 is block diagram of a method of encapsulating a circuit board according to the embodiments of the subject invention.

DETAILED DESCRIPTION OF THE INVENTION

Figure 1:
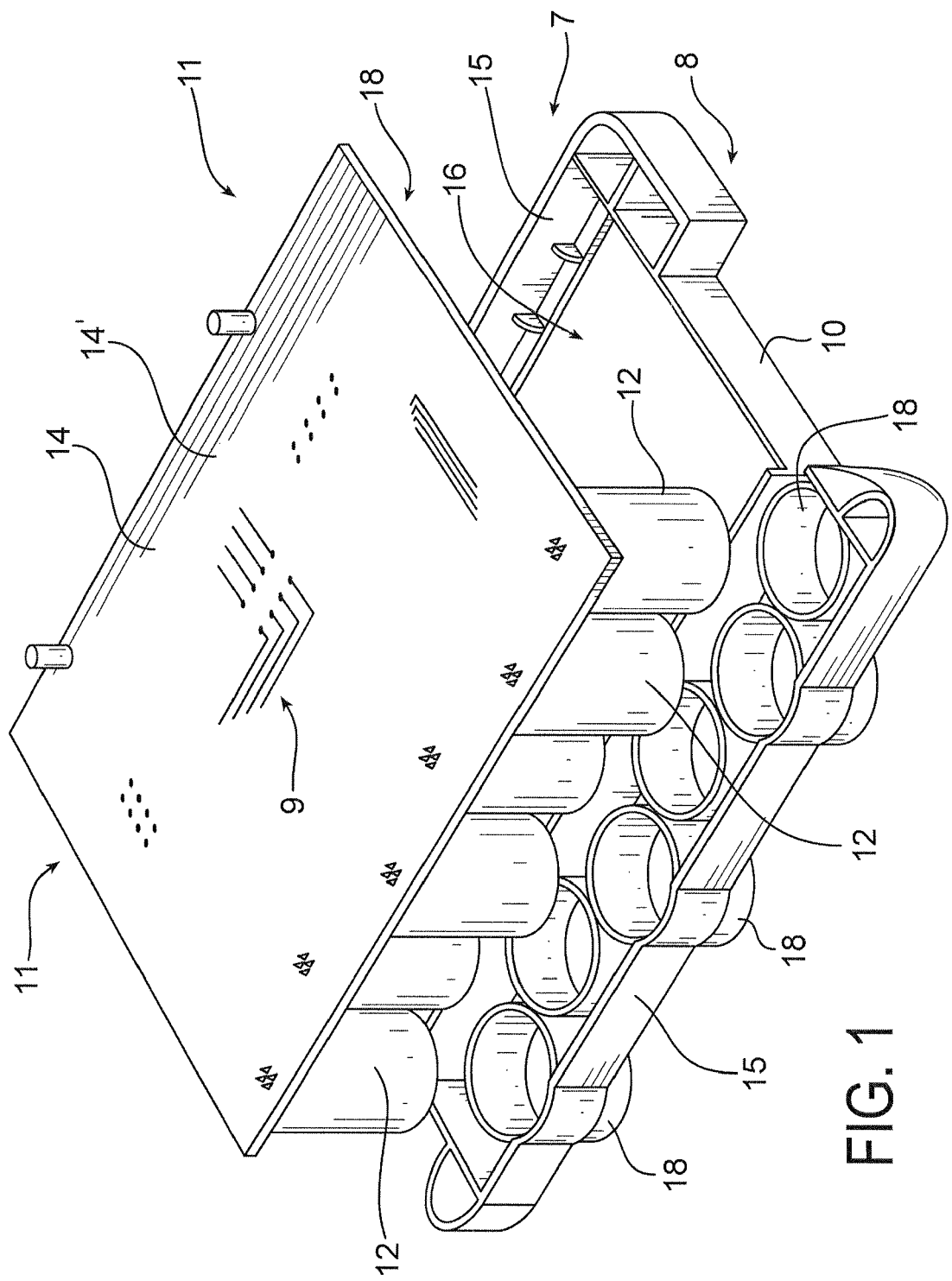
FIG. 1 is a perspective view of a circuit board having electrical components mounted thereon prior to insertion into a frame tray according to the embodiments of the subject invention.
Figure 2:
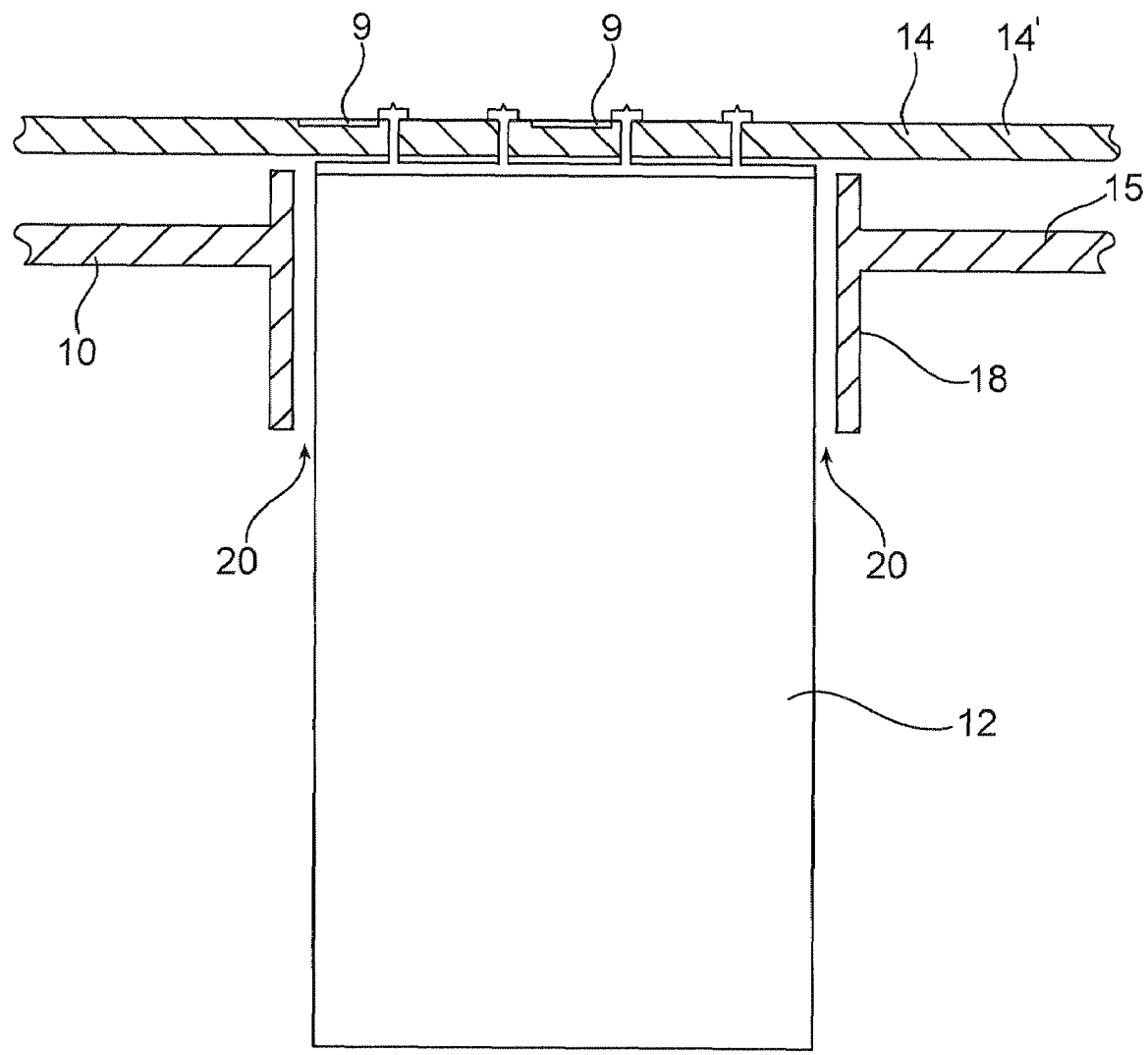
FIG. 2 is a cross-sectional view of an electrical component mounted onto a circuit board that is inserted within a receptacle of the frame tray according to the embodiments of the subject invention.

Referring now to the drawings wherein the showings are for purposes of illustrating embodiments of the invention only and not for purposes of limiting the same, FIGS. 1 and 2 show a frame 10, also termed frame tray 10, for housing an electrical circuit, illustrated generally at 11. The electrical circuit 11 may include at least one electrical component 12 that may be mounted onto circuit board 14. Examples of electrical components 12 may include resistors, transistors, capacitors, integrated circuits, logic processors, heat sinks and the like. The electrical circuit 11 may be used in an article of industrial equipment, examples of which may include welding equipment, industrial controllers and the like.

The circuit board 14 comprises a mounting support for the electric components 12, which may be interconnected by physical wiring. Alternatively, circuit board 14 may be a printed circuit board 14', having conductive traces 9 printed thereon for interconnecting the electrical components 12. It is to be construed that any structure of assembling an electrical circuit 11 may be chosen without departing from the scope of coverage of the embodiments of the subject invention.

The frame tray 10 may generally be polygonal in configuration. More specifically, the frame tray 10 may be rectangular in shape. Although, the shape of the frame tray 10 should not be construed as limiting. In one embodiment, the frame tray 10 may be integrally fashioned as a single piece of molded plastic, like for example thermoplastic. The frame tray 10 may also be constructed from metal. Persons of ordinary skill in the art will readily understand the application to numerous other types of suitable materials. The frame tray 10 is configured having one or more walls 15 that define a generally open first side 7 for receiving the circuit board 14. The second side 8 of the frame tray 10 may be generally enclosed for containing an encapsulating material 22 as will be discussed in detail below.

With continued reference to FIGS. 1 and 2, as mentioned above, the frame tray 10 is constructed to include an area 16 configured to receive and house the circuit board 14. Mounting holes or fastener holes, not shown, may be included, which can be used to receive fasteners for securing the circuit board 14 in place. Although, any means of securing the circuit board 14 to the frame tray 10 may be chosen with sound engineering judgment. The first side 7 of the frame tray 10 may be open for insertion of the circuit board 14 during assembly. This is contrasted with the second side 8 of the frame tray 10, which may be generally enclosed for holding or containing an encapsulating material to be discussed further below. The frame tray walls 15 may therefore define a volumetric region within which the circuit board 14 may reside. It will appreciated that some electrical components 12 have a length that may extend a distance outward from the circuit board 14. These electrical components 12 may require openings in the frame tray walls 15 for accommodating the electrical components' 12 size, i.e. length, and/or orientation. As such, the frame tray 10 may include at least one aperture 18 or receptacle 18 through which electrical components 12 are received. In this manner, electrical components 12 are received by the apertures 18. It will be realized that when an electrical component 12 is received within receptacle 18 of frame tray 10, a gap 20 may be formed between the circumference of the aperture 18, i.e. the wall of receptacle 18 and the outer surface of the electrical component 12, the import of which will be realized shortly. Furthermore, surface imperfections located on the exterior portion of the electrical component 12 may also contribute to the size of gap 20 between the wall of receptacle 18 and the outer surface of electrical component 12. It will appreciated that the gap may vary at different points around the circumference of the aperture 18. It is noted here that other openings within the frame tray walls 15 may be included for accommodating other circuit components, not shown. Such openings may be sealed by gaskets or any other suitable means for forming an enclosed frame tray 10.

In order to protect the circuit board 14, which may be a printed circuit board 14', from ambient conditions or environmental contaminates like moisture and dust, when housed in frame tray 10, an encapsulating material 22, which in one embodiment includes a potting compound, may be applied and cured within frame tray 10 to substantially encapsulate the circuit board 14. The encapsulating material 22 may be comprised of a curable material 22' being generally fluid until exposed to the air and/or mixed with other components. Over time the curable material 22' solidifies. However, in the past, when applied to the circuit board 14, the curable material 22' migrates into the gap 20 between the wall of receptacle 18 and the outer surface of the electrical component 12 and leaks or seeps down the exterior wall of electrical component 12. The leakage of the curable material 22', when cured, is unsightly and can impair the performance of electrical component 12 and may lead to damaging circuit board 14.

Figure 3:
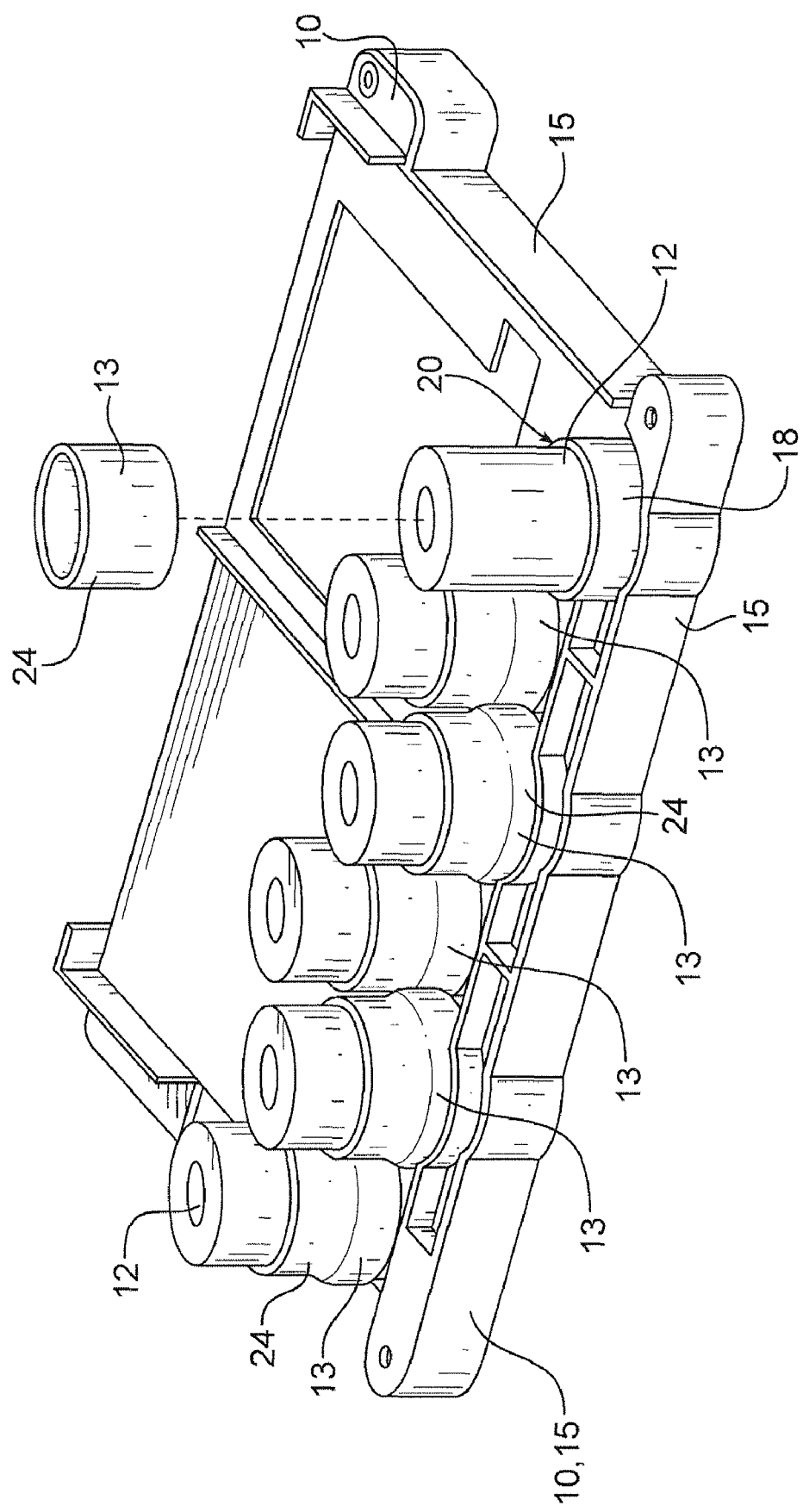
FIG. 3 is a perspective view of a circuit board having electrical components mounted thereon housed within a frame tray according to the embodiments of the subject invention.

Referencing FIG. 3, means for sealing around the electrical components 12 mounted to circuit board 14 and extended through the frame tray walls 15 may be provided to seal the gap 20 between the circumference of the aperture 18 and the outer surface of electrical component 12. Means for sealing may comprise a band of material 13 capable of conforming to irregular and/or discontinuous surfaces. In one embodiment, means for sealing may include a thermoplastic material 24. One type of thermoplastic material 24 may be composed of a polyolefin, a fluoropolymer, a polyvinyl chloride, a polychloroprene, a silicone elastomer and mixtures thereof. In another embodiment, means for sealing may comprise a material that contracts or constricts when exposed to heat at a particular temperature or other energy sources. Heat shrink tubing is one such type of material. Other embodiments may include tape, which may have an adhesive applied to one or more sides thereof. The tape may or may not constrict like the heat shrink tubing, but may be pliable for conforming to irregular and uneven surfaces, being held in place by the adhesive until the encapsulating material 22 cures.

Accordingly, as shown in FIG. 3, the gap 20 may be sealed by applying the band of material 13 onto a portion of the outer surface of electrical component 12 and over the wall of receptacle 18. In one embodiment, a source of heat may be applied to the band of material 13 to shrink and thus seal gap 20 between the wall of receptacle 18 and the outer surface of the electrical component 12. It is noted that other sources of energy, e.g. radiation or light, may be used to activate, in this instance shrink, the band of material 13. In another embodiment of the subject invention, a source of ultra-violet light may be applied to shrink the band of material 13 and substantially seal the gap 20 between the wall of receptacle 18 and the outer surface of the electrical component 12. In this way, the band of material 13 constricts and conforms to any uneven exterior surface found on the electrical components 12 and substantially eliminates leakage of the potting compound through the gap 20.

Figure 4:
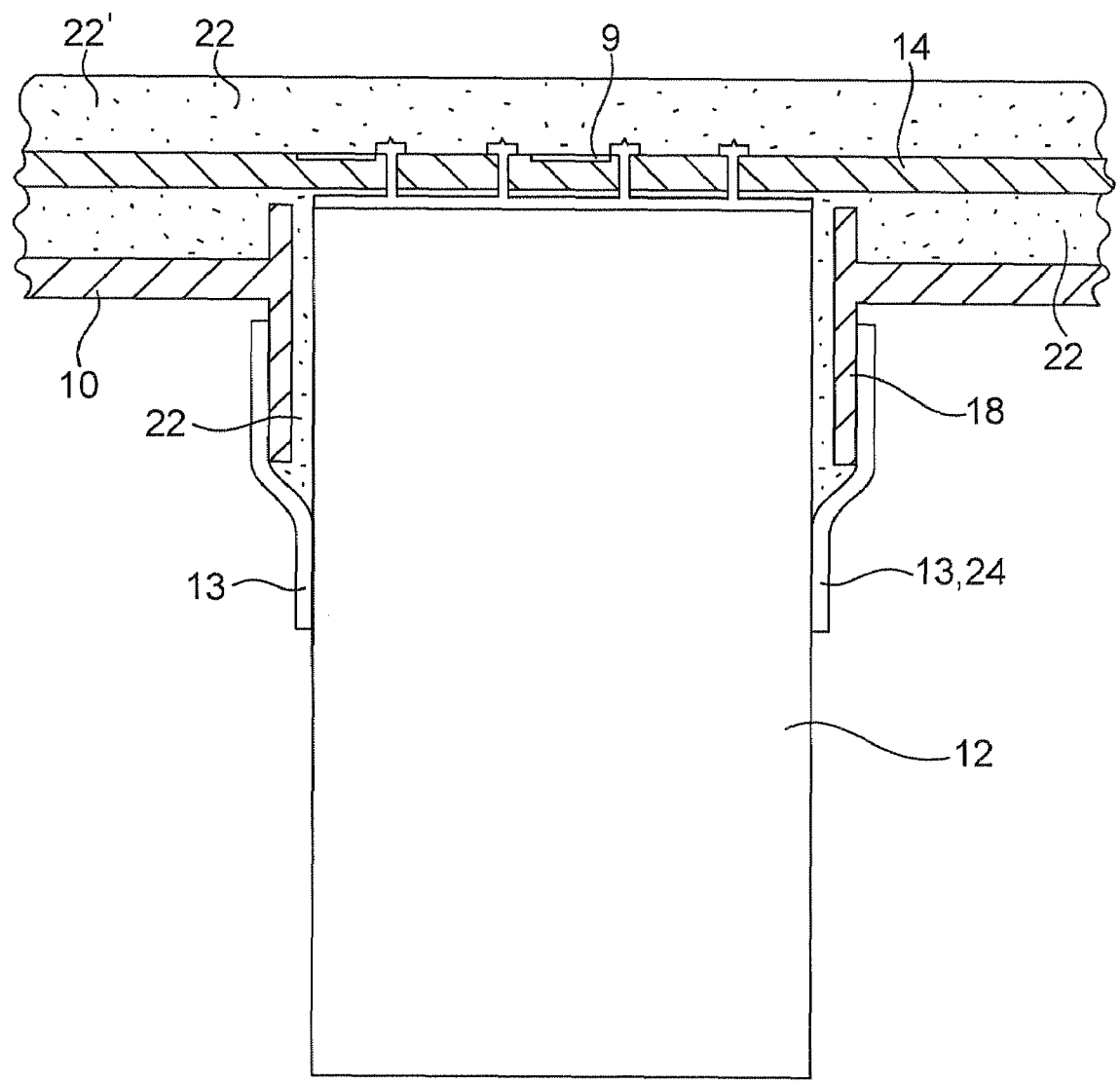
FIG. 4 is a partial, cross-sectional view of an encapsulated circuit board according to the embodiments of the subject invention.
Figure 5:
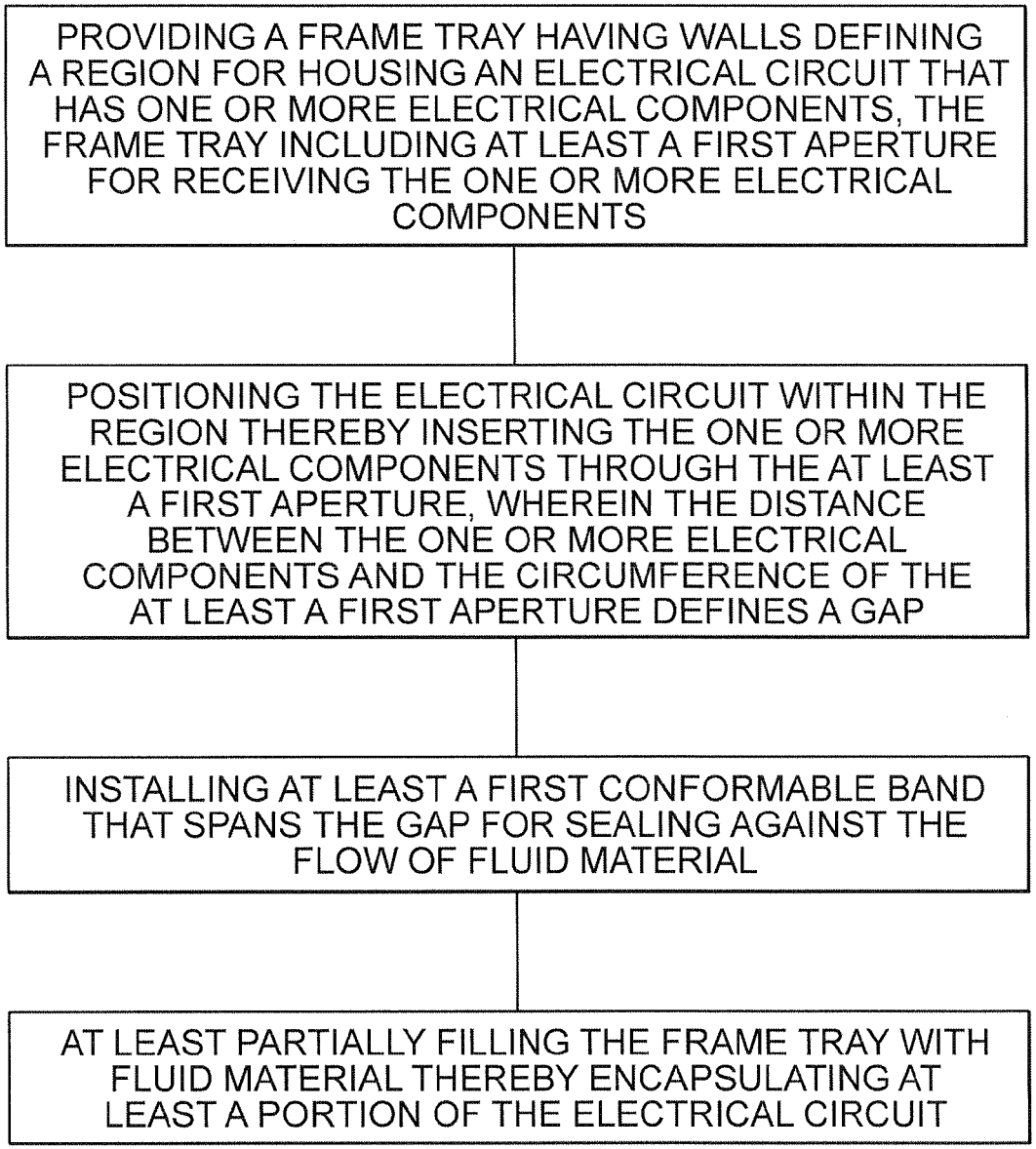
FIG. 5 is a block diagram of a method of encapsulating an electrical circuit according to the embodiments of the subject invention.

With reference to FIG. 4, the curable material 22' may include a one-component epoxy system, a two-component epoxy system, a one-component silicone system, a two-component silicone system, a polyurethane system, a polyester system and mixtures thereof, or any encapsulating material as is appropriate for use with the embodiments of the subject invention.

In one embodiment of the invention, two-component epoxy materials may be used as the curable material. Two-component epoxy materials may include one or more epoxy resins that are selectively combined with one or more curing agents or hardeners, such as a variety of active hydrogen compounds including polyamines, polyacids, polymercaptans, polyphenols, polyamides and polyureas. Additional materials and additives, such as extenders, fillers, reinforcing agents, colorants (e.g., pigments or dyes), organic solvents, plasticizers, flexibilizers, tackifiers, diluents, adhesion promoters, thixotropic agents, rheological agents, and the like, may be incorporated into either of the two components, as is known in the art.

Two-component epoxy-based materials are typically readily curable at room temperature, but can be inconvenient to use and store. The components of two-component systems must be accurately measured and properly mixed just prior to use. Thus, the various components to be mixed must be separately stored until use and have uniform properties.

In another embodiment of the invention, a one-component epoxy-based material may be used as an alternative to the two-component epoxy material. These one-component materials are typically available for industrial application in two basic forms: rigid epoxy adhesives and frozen pre-mix, flexible epoxy adhesives. Rigid epoxy materials may include such compounds as bisphenol-A epoxy materials and novolac-based materials. These rigid epoxy materials exhibit strong adhesion for many materials and may be conveniently stored at room temperature. Flexible epoxy materials form more pliable bonds that are capable of successfully adapting to stresses between dissimilar materials caused by differing rates of expansion. However, in contrast to rigid epoxy materials, frozen pre-mix flexible epoxy materials must be stored in a frozen state and must be thawed prior to use.

With further reference to FIGS. 1 through 6, the circuit board 14 may be positioned within area 16 of frame tray 10 that is open and configured to receive and house circuit board 14 such that electrical component 12, that is mounted onto a portion of circuit board 14, may be received and housed within receptacle 18 of frame tray 10. Since gap 20 may be formed between the wall of receptacle 18 and the outer surface of electrical component 12 when electrical component 12 is housed within receptacle 18 of frame tray 10, means for sealing may be used to cover a portion of electrical component 12 mounted to circuit board 14 and wall of receptacle 18 to substantially seal gap 20. The use of the means for sealing has the advantages of being able to compress and conform to the irregular exterior surfaces commonly found on electrical component 12 and eliminate the problems caused by the size variation of gap 20. Subsequently, a curable material may be applied and cured within frame tray 10 to substantially encapsulate circuit board 14 within curable material 22'. The curable material 22' may then be allowed to solidify or harden.

Based upon the foregoing disclosure, it should now be apparent that the system and methods of sealing electrical components as described herein will carry out the objects set forth hereinabove. It is, therefore, to be understood that any variations evident fall within the scope of the claimed invention and thus, the selection of specific component elements can be determined without departing from the spirit of the invention herein disclosed and described.

What is claimed is:

1. A method of encapsulating an electrical circuit in a frame tray, comprising the steps of:
   providing a frame tray having walls defining a region for housing an electrical circuit that has one or more electrical components, the frame tray including at least a first aperture for receiving the one or more electrical components;
   positioning the electrical circuit within the region thereby inserting the one or more electrical components through the at least a first aperture, wherein the distance between the one or more electrical components and the circumference of the at least a first aperture defines a gap;
   installing at least a first conformable band that spans the gap for sealing against the flow of fluid material; and,
   at least partially filling the frame tray with fluid material thereby encapsulating at least a portion of the electrical circuit.

2. The method as defined in claim 1, wherein the at least a conformable band is a shrinkable band.

3. The method as defined in claim 2, wherein the shrinkable band is heat activated to shrink from a first diameter to a second smaller diameter.

4. The method as defined in claim 1, further comprising the step of:

providing tape having at least one side coated with an adhesive; and, wherein the step of installing at least a first conformable band that spans the gap, comprises the step of:

applying the tape to seal the gap between the one or more electrical components and the at least a first aperture.

5. The method as defined in claim 1, wherein the fluid material comprises a curable material.

6. The method as defined in claim 5, wherein the curable material is a potting compound selected from the group of: a one component epoxy system, a two component epoxy system, a one component silicone system, two component silicone system, a polyurethane system, a polyester system and mixtures thereof.

7. A method of encapsulating a circuit board, comprising the steps of:

providing a circuit board having one or more capacitors extending from the circuit board;

providing a frame tray configured to receive the circuit board, the frame tray defining a region for encasing the circuit board, and wherein the frame tray includes one or more apertures for receiving the one or more capacitors respectively;

installing the circuit board into the frame tray whereby the one or more capacitors extend through the one or more apertures, and wherein the distance between the one or more aperture circumferences and the one or more capacitors define a gap;

installing heat shrink tubing to span the gap;

applying heat from an associated heat source to shrink the heat shrink tubing thereby sealing the gap; and, filling at least part of the region with a curable resin for encasing the circuit board.

* * * * *